United States Patent [19]

Klein

[11] Patent Number: 4,690,745
[45] Date of Patent: Sep. 1, 1987

[54] TARGETS FOR CATHODE SPUTTERING

[75] Inventor: Hans D. Klein, Darmstadt, Fed. Rep. of Germany

[73] Assignee: Merck Patent Gesellschaft mit beschränkter Haftung, Darmstadt, Fed. Rep. of Germany

[21] Appl. No.: 934,978

[22] Filed: Nov. 25, 1986

Related U.S. Application Data

[62] Division of Ser. No. 569,696, Jan. 10, 1984, Pat. No. 4,647,548.

[30] Foreign Application Priority Data

Jan. 10, 1983 [DE] Fed. Rep. of Germany ....... 3300525

[51] Int. Cl.$^4$ ............................................. C23C 14/00
[52] U.S. Cl. ................................ 204/192.29; 428/432
[58] Field of Search ................... 501/134; 204/192.29, 204/192.15; 428/432

[56] References Cited

U.S. PATENT DOCUMENTS

| | | | |
|---|---|---|---|
| 3,438,885 | 4/1969 | Lewis et al. | 204/192.29 |
| 3,749,658 | 7/1973 | Vossen, Jr. | 204/192.29 |
| 4,025,339 | 5/1977 | Kuehnle | 204/192.29 |
| 4,060,426 | 11/1977 | Zinchuk | 204/192.29 |
| 4,065,600 | 12/1977 | King et al. | 204/192.15 |
| 4,124,474 | 11/1978 | Bomchil | 204/192.15 |
| 4,166,784 | 9/1979 | Chapin et al. | 204/192.29 |
| 4,201,649 | 5/1980 | Gillery | 204/192.29 |
| 4,400,254 | 8/1983 | Freller et al. | 204/192.29 |

FOREIGN PATENT DOCUMENTS

| | | | |
|---|---|---|---|
| 2441582 | 11/1979 | France . | |
| 2095703 | 3/1981 | United Kingdom | 204/192.15 |

OTHER PUBLICATIONS

Fraser et al., J. Electrochem. Soc. 119 (1972), pp. 1368–1374.

Primary Examiner—Arthur P. Demers
Attorney, Agent, or Firm—Millen & White

[57] ABSTRACT

Oxide-ceramic targets which can be used in magnetically enhanced cathode sputtering and which are based on hot-pressed indium oxide/tin oxide mixtures, which have a density of at least 75% of the theoretical density and which have been diminished to such an extent in the oxygen content compared with the stoichiometric composition that they have an electrical conductivity which corresponds to a specific resistance of 0.6 to 0.1 $\Omega$. cm can be prepared by compression-molding the metal oxide mixture in a reducing atmosphere under a pressure of 50 to 600 kg/cm$^2$ and at a temperature of 850° to 1,000° C.

The targets can be used in direct-voltage sputtering.

14 Claims, No Drawings

TARGETS FOR CATHODE SPUTTERING

This is a division of Ser. No. 569,696 filed Jan. 10, 1984, now U.S. Pat. No. 4,647,548.

BACKGROUND OF THE INVENTION

This invention relates to oxide-ceramic targets useful in magnetically enhanced cathode sputtering and which are based on hot-pressed indium oxide/tin oxide mixtures.

Targets of this type are known per se, and it is also known to use such targets for producing transparent electrically conductive layers.

Since the metal oxides which are press-molded into targets under pressure and at elevated temperatures are non-conductors, it is customary to sputter these targets by means of high frequency, with which even non-conductors can be sputtered without difficulty. However, high-frequency sputtering is not very suitable for large-scale industrial application, where direct-voltage sputtering is inherently preferable, but primarily requires metallic targets and not oxide-ceramic targets.

However, if metallic targets are used, the preparation of transparent oxide layers requires an oxidation to take place as the target material is applied to the surface to be coated or afterwards. This working method generally does not lead to satisfactory layers and is not even possible on all materials to be coated.

SUMMARY OF THE INVENTION

It is therefore an object of this invention to provide oxide-ceramic targets which are also suitable for direct-voltage sputtering, in particular for high-power density use in magnetically enhanced cathode sputtering.

Upon further study of the specification and appended claims, further objects and advantages of this invention will become apparent to those skilled in the art.

Is has now been found that targets, which, on the one hand, have a very high density and, on the other, have been diminished to such an extent in their oxygen content that a relatively high electric conductivity results, can be very successfully used in high-power direct-voltage sputtering units. It is surprising that these targets, the oxygen content of which can have been lowered to such an extent that metallic portions are already present, nevertheless generate very homogeneous metal oxide layers which are free of any metallic inclusions which could impair the transparency of the layer.

Accordingly, this invention provides oxide-ceramic targets which are useful in magnetically enhanced cathode sputtering and which are based on hot-pressed indium oxide/tin oxide mixtures, and which have a density of at least 75% of the theoretical density and have been diminished to such an extent in the oxygen content compared with the stoichiometric composition that they have an electric conductivity which corresponds to a specific resistance of 0.6 to 0.1 $\Omega \cdot$cm.

DETAILED DISCUSSION

It is a significant advantage of the targets according to this invention that they are highly suitable for high-power sputtering using direct voltage, by virtue of the fact that they combine a high density with a relatively high conductivity.

The process for hot-pressing oxide-ceramic targets is known per se. In it, the metal oxide powders are put in heatable presses under high pressures of up to several hundred atmospheres at the sintering temperature, which is generally about ⅔ of the absolute melting temperature. The resulting ceramic bodies differ in density, depending on the temperature used, the pressure and the material-specific properties of the particular metal oxide.

Targets based on indium oxide and tin oxide and having densitites of about 50–70% of the theoretical density are commercially available. Although targets with a density of at least 75% of the density of the solid substance are mentioned in German Offenlegungsschrift No. 3,112,104, no process is described for obtaining these targets. It has now been found that targets of this type can be prepared by hot-pressing indium oxide/tin oxide mixtures at certain temperatures in a reducing atmosphere.

The invention accordingly also provides a process for preparing oxide-ceramic targets which can be used in magnetically enhanced cathode sputtering and which are based on hot-pressed indium oxide/tin oxide mixtures, wherein the metal oxide mixture is compression-molded to such an extent in a reducing atmosphere under a pressure of 50 to 600 kg/cm$^2$ and at a temperature of 850° to 1,000° C. that the target gets a density of at least 75% of the theoretical density.

The pressing temperature of 850°–1,000° C. is much below the sintering temperature expected from the abovementioned rule of thumb for indium oxide, which has a melting point of 1,910° C., and tin oxide, which has a melting point of 1,620° C. Indeed, microscopic inspection of the pressed materials reveals that normal sintering does not take place, since normal sintering is generally marked by a coarsening of the particulate structure due to very fine portions dissolving and relatively large particles growing by a corresponding amount. This coarsening cannot be observed in the case of the indium oxide/tin oxide targets. On the contrary, the particle size remains largely constant.

It is essential that the process according to the invention be carried out in a reducing atmosphere, namely, preferably, by press-molding the starting material in a graphite mold. To create a more powerful reducing atmosphere, the metal oxide powder can have added to it coal or a carbon-yielding substance. It has been found suitable, for example, to use covering layers between the metal oxide powder and the pressing ram which are made of an organic material, for example a cellulose-based material, such as, for example, paper. It can be assumed that the gases which form in the coking process, which takes place at the high temperatures, cause a partial reduction of the indium oxide. It can also be assumed that the resulting metallic indium, which is in the form of a liquid, acts as a lubricant for the oxide powder and thus permits a considerable compaction of the powder.

It can be noted without, however, being bound by this theory, or any other mentioned herein, that the targets prepared by the process according to the invention have a considerable oxygen deficit which is even evident in the appearance of the targets, which are colored gray by the suboxide or metallic content.

Depending on the temperature used and the duration of the pressing, it is therefore possible to obtain targets having up to 90 to 95% of the theoretical density, preferably 75 to 90%.

If excessively high temperatures or excessively long pressing times are used, the metal oxide can be completely reduced, and the resulting liquid metal runs out of the pressing mold. However, these undesirable conditions can be eliminated by a few preliminary experiments. It has been found that very good results are obtained at temperatures of 880° to 920° C. e.g., 900°-920° C. in particular. The total duration of the pressing step, including the heating period, is about 1 to 2 hours, of which at most about half an hour, preferably 10 minutes, is taken up by pressing at the maximum temperature.

The degree of pressing, i.e. the ratio of the density produced in the course of pressing relative to the theoretical density of the solid substance, can be fixed in advance by fixing the compression path of the pressing ram and, in so doing, of course, allowing also for the thermal expansion of the pressing mold and of the pressing ram. The dependence of the degree of pressing on the compression path can be easily determined empirically for any pressing mold and any pressing temperature.

The molding pressure as such is not particularly critical and can be at most about 600 kg/cm$^2$ in terms of the pressure borne by the graphite mold. However, it has been found that pressures as high as that are not necessary for good results. Indeed, very good results are obtained at unusually low pressures of about 50 kg/cm$^2$. It is therefore preferable to work within a range from about 50 to 100 kg/cm$^2$, in particular at about 70 kg/cm$^2$. These low molding pressures prolong the life of the press, which is put under less stress as a consequence.

The process according to the invention produces indium oxide/tin oxide targets which contain indium oxide as the main component. The tin oxide content can vary from about 1 to 20% by weight. It is preferably about 9 to 11% by weight.

The most suitable conditions for a desired result in respect of target density and composition can be determined by means of a few routine preliminary experiments. In this experimental work, it can be assumed, as a rule, that prolonging the duration of pressing and increasing the pressing temperature produce targets which are not only denser but also have a higher oxygen deficit. The higher the oxygen deficit, the higher is also the conductivity of the targets. In general the conditions will be chosen in such a way as to produce targets having a conductivity which corresponds to a specific resistance of about 0.6 to 0.1 $\Omega$·cm.

The conductivity of the targets can, if appropriate, also be controlled by admixing the metal oxide powder with metal powder, namely up to 2% by weight of indium and/or tin, based on the original mixture weight, before the pressing step.

In addition to being highly suitable, as already mentioned, for high-power direct-voltage sputtering, the targets according to the invention are also mechanically particularly stable by virtue of their high density. This high mechanical stability, together with the likewise very high thermal conductivity, which permits the heat arising in the course of sputtering to be conducted away quickly, is a further significant advantage of the targets according to the invention.

The targets can be advantageously used for coating, in particular, sheet-like substrates, such as, for example, in the preparation of conductive transparent layers on paper or of transparent thermally protective layers on glass, or in the production of transparent conductivity layers in liquid crystal displays. All these processes known per se can use the targets according to the invention in direct-voltage sputtering. All these processes produce very good transparent layers. The only essential condition in these processes is that the sputtering atmosphere contains a certain amount of oxygen. The oxygen content that is necessary in a particular case can be readily determined by means of a few orientating experiments. The oxygen content will generally be about 1 to 20% by volume, and the remaining atmosphere can consist, for example, of hydrogen and argon.

The invention therefore represents a significant advance in the art of high-power sputtering.

Unless indicated otherwise herein all aspects of the preparation and use of the targets of this invention are fully conventional.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever. In the following examples, all temperatures are set forth uncorrected in degrees Celsius; unless otherwise indicated, all parts and percentages are by weight.

EXAMPLE 1

A cylindrical graphite mold which has an internal diameter of 210 mm is charged with 1,700 g of a mixture of 1,516 g of indium oxide and 184 g of tin(IV) oxide powder, which corresponds to a molar ratio of indium to tin of 9:1, and a layer of filter paper is placed between the mixture and the upper and lower graphite pressing ram. A pressure of 70 kg/cm$^2$ is set, and the unit is evacuated and heated to 880° C. in the course of 35 minutes under constant pressure. The compaction of the molding material, which starts at about 700° C., is recorded by reference to the movement of the pressing ram. As soon as the molding material has been compressed to a thickness of 9.2 mm, the heating is switched off, pressing is continued for a further 10 minutes, and the pressure is then let down. This gives a ceramic plate which has a gray appearance, a thickness of 9.2 mm, a density of 5.3 g/cm$^3$, which corresponds to 75% of the theoretical density, and a specific resistance of 0.42 $\Omega$·cm.

EXAMPLE 2

A cylindrical graphite mold which has an internal diameter of 210 mm is charged with 1,700 g of a mixture of 1,516 g of indium oxide and 184 g of tin(IV) oxide powder, 2 layers of filter paper being inserted at either side between powder and graphite ram. A pressure of 70 kg/cm$^2$ is set, and the unit is evacuated and heated to 900° C. in the course of 40 minutes under constant pressure. As soon as the molding material has been pressed to a thickness of 8.3 mm, the heating is switched off, pressing is continued for a further 10 minutes, and the pressure is then let down. This gives a ceramic plate which has a gray appearance, a thickness of 8.3 mm, a density of 5.9 g per cm$^3$, which corresponds to 82.7% of the theoretical density, and a specific resistance of 0.38 $\Omega$·cm.

EXAMPLE 3

A cylindrical graphite mold which has an internal diameter of 210 mm is charged with 1,700 g of a mixture of 1.516 g of indium oxide and 184 g of tin(IV) oxide powder, 3 layers of filter paper being inserted at either side between powder and graphite ram. A pressure of 70 kg/cm² is set, and the unit is evacuated and heated to 920° C. in the course of 45 minutes under constant pressure. As soon as the molding material has been pressed to a thickness of 7.8 mm, the heating is switched off, pressing is continued for a further 10 minutes and the pressure is then let down. This give a ceramic plate which has a gray appearance, a thickness of 7.8 mm, a density of 6.3 g per cm³, which corresponds to 88.5% of the theoretical density, and a specific resistance of 0.17 Ω·cm.

EXAMPLE 4

A cylindrical graphite mold which has an internal diameter of 210 mm is charged with 1,700 g of a mixture of 1,608 g of indium oxide, 92 g of tin(IV) oxide, which corresponds to a molar ratio of indium to tin of 95:5, and 34 g of graphite powder. A pressure of 70 kg/cm² is set, and the unit is evacuated and heated to 880° C. in the course of 35 minutes under constant pressure. As soon as the molding material has been pressed to a thickness of 8.4 mm, the heating is switched off, pressing is continued for a further 10 minutes, and the pressure is then let down. This gives a ceramic plate which has a gray appearance, a thickness of 8.5 mm, a density of 5.8 g per cm³, which corresponds to 80% of the theoretical density, and a specific resistance of 0.38 Ω·cm.

EXAMPLE 5

A cylindrical graphite mold which has an internal diameter of 210 mm is charged with 1,700 g of a mixture of 1,337 g of indium oxide, 340 g of tin(IV) oxide and 17 g of tin powder, which corresponds to a molar ratio of indium to tin of 80:20. A pressure of 90 kg/cm² is set, and the unit is evacuated and heated to 900° C. in the course of 40 minutes under constant pressure. As soon as the molding material has been pressed to a thickness of 8.5 mm, the heating is switched off, pressing is continued for a further 10 minutes, and the pressure is then let down. This gives a ceramic plate which has a gray appearance, a thickness of 8.5 mm, a density of 5.77 g per cm³, which corresponds to 80% of the theoretical density, and a specific resistance of 0.35 Ω·cm.

The preceding examples can be repeated with similar success by substituting the generically or specifically described reactants and/or operating conditions of this invention for those used in the preceding examples. From the foregoing description, one skilled in the art can easily ascertain the essential characteristics of this invention, and without departing from the spirit and scope thereof, can make various changes and modifications of the invention to adapt it to various usages and conditions.

What is claimed is:

1. In a process for coating a substrate by direct voltage sputtering thereon of a target, the improvement wherein the target is an oxide-ceramic composition comprising a hot-pressed indium oxide/tin oxide mixture of a density of at least 75% of the theoretical density and which has been diminished to such an extent in its oxygen content compared with the stoichiometric composition that it has an electric conductivity which corresponds to a specific resistance of 0.6 to 0.1 Ω·cm.

2. In a process for coating a substrate by direct voltage sputtering thereon of a target, the improvement wherein the target is an oxide-ceramic composition prepared by a process comprising compression-molding the indium oxide/tin mixture to such an extent in a reducing atmosphere under a pressure of 50 to 600 kg/cm² and at a temperature of 850 Ⓡ to 1,000° C. that the composition's density is at least 75% of the theoretical density.

3. A process of claim 1, wherein the direct voltage sputtering is magnetically enhanced cathode sputtering.

4. In a substrate coated with a conductive, transparent layer of an oxide, the improvment wherein the layer has been coated onto the substrate by the process of claim 1.

5. A process of claim 1, wherein in said composition the amount of tin oxide in the mixture is 1–20% by weight and of indium oxide is 99–80% by weight.

6. A process of claim 1, wherein in said composition the amount of tin oxide is 9–11% by weight.

7. A process of claim 1, wherein said composition has a density which is 75–90% of the theoretical density.

8. A process of claim 1, wherein said composition has a density which is 75–95% of the theoretical density.

9. A process of claim 2, wherein a temperature of 900° to 920° C. and a pressure of 50 to 100 kg/cm² are maintained during the compression-molding.

10. A process of claim 2, wherein the compression-molding takes place in a graphite mold.

11. A process of claim 2, wherein carbon or an organic material which produces carbon at the compression-molding temperature is present in the molding press.

12. A process of claim 2, wherein up to 2% by weight of tin or indium powder is contained in the metal oxide powder mixture.

13. A process of claim 2, wherein the temperature and the duration of the compression-molding are such that the resultant composition's electrical conductivity corresponds to a specific resistance of 0.6 to 0.1 Ω·cm.

14. A process according to claim 2, wherein the compression molding time is 1–2 hours in total and the time of the mold at its highest temperature is about 30 minutes.

* * * * *

UNITED STATES PATENT AND TRADEMARK OFFICE
CERTIFICATE OF CORRECTION

PATENT NO. : 4,690,745

DATED : September 1, 1987

INVENTOR(S) : Hans Dietrich Klein et al

It is certified that error appears in the above-identified patent and that said Letters Patent is hereby corrected as shown below:

Column 6, Claim 2, Line 16:

Reads: "$kg/cm^2$ and at a temperature of 850® to 1,000° C. that"

should Read: --$kg/cm^2$ and at a temperature of 850 to 1,000° C. that--

Signed and Sealed this

Fifth Day of January, 1988

*Attest:*

DONALD J. QUIGG

*Attesting Officer*  *Commissioner of Patents and Trademarks*